United States Patent [19]

Miller et al.

[11] Patent Number: 4,602,225

[45] Date of Patent: Jul. 22, 1986

[54] APPARATUS FOR FREQUENCY CORRECTION IN A FREQUENCY SYNTHESIZER

[75] Inventors: Brian M. Miller, Spokane; Charles R. Kogler, Liberty Lake, both of Wash.

[73] Assignee: Hewlett Packard Company, Palo Alto, Calif.

[21] Appl. No.: 625,994

[22] Filed: Jun. 24, 1984

[51] Int. Cl.⁴ .............................................. H03C 3/00
[52] U.S. Cl. ................................. 332/19; 331/1 A; 331/2; 331/14; 331/16; 331/77; 331/25; 455/76
[58] Field of Search .................. 331/2, 14, 16, 17, 25, 331/1 A; 332/19; 455/75, 76

[56] References Cited

U.S. PATENT DOCUMENTS

| | | | |
|---|---|---|---|
| 4,105,946 | 8/1978 | Ikeda | 331/16 X |
| 4,105,948 | 8/1978 | Wolkstein | 331/14 |
| 4,320,357 | 3/1982 | Wulfsberg et al. | 331/25 X |

Primary Examiner—Eugene R. LaRoche
Assistant Examiner—James C. Lee
Attorney, Agent, or Firm—Leslie G. Murray

[57] ABSTRACT

The present invention provides apparatus and a method for determining and correcting frequency offset for use in a frequency synthesizer to provide external control and DC frequency modulation of the synthesizer output frequency. The technique provides DCFM capability by unlocking a phase-lock loop (PLL) which provides the synthesizer reference frequency and making the PLL oscillator (VCO) tune line available for external inputs. Utilizing a frequency counting circuit, the exact output frequency of the VCO is determined. The desired VCO frequency is compared with the actual VCO frequency to derive an error signal proportional to any offset in the VCO frequency resulting from unlocking the PLL. The error signal is then utilized to compensate (the synthesizer output signal) for any frequency change as a result of unlocking the PLL.

2 Claims, 3 Drawing Figures

APPARATUS FOR FREQUENCY CORRECTION IN A FREQUENCY SYNTHESIZER

BACKGROUND AND SUMMARY

The present invention relates to a method and apparatus for providing DCFM capability in a signal generator and, in particular, to a frequency count and correct technique utilized with an unlocked phase-locked loop.

It is often desirable to have a signal generator which possesses the capability to perform like a voltage controlled oscillator, i.e., the signal generator output signal is dependent on an input voltage under operator control. This capability allows the operator not only to perform sweep-like measurements, but also allows frequency modulation (FM) of the output signal at very low rates, down to DC (thus the name DCFM).

It is known to provide an output signal variable over a given frequency range with a DCFM capability. One such signal generator comprises a frequency synthesizer utilizing one or more phase-locked loops (PLL). A PLL is in effect a control system that maintains a constant phase difference between two signals. Any variations in the phase of one signal relative to the other are removed by the PLL. This property of a PLL is utilized to suppress noise and clean up a signal; however, this property also tends to suppress any FM of the PLL output within the loop bandwidth. The loop must be modified in some way to allow DCFM. One technique is described in U.S. patent application Ser. No. 581,767, filed on Feb. 21, 1984, by Marcus K. DaSilva et al., entitled "Frequency Modulation in a Phase Locked Loop".

A second technique provides DCFM capability by opening—unlocking—the PLL and making the oscillator tune line available to the operator. The advantage of this technique is that it is simple, but the primary disadvantage is that a frequency offset in the output will occur when the loop is unlocked. Typically, the approach is to optimize the circuit hardware so as to minimize the frequency offset when the PLL is unlocked. This can be expensive and difficult to manufacture. The present invention solves the problem by allowing a relatively large frequency offset at the unlocked PLL and corrects for the frequency offset at another point in the frequency synthesizer.

The present invention includes a PLL capable of being unlocked and a three mode counter controlled by a 68000 microprocessor. When the operator selects external DCFM operation, the FM PLL is unlocked and the voltage controlled oscillator (VCO) tune line is made available to external control. Utilizing the counter, the exact frequency of the unlocked loop is determined. Since the desired frequency and the actual frequency of the VCO are known, the frequency error in the synthesizer output signal can be computed. An error signal is then provided to correct for the frequency change in the output frequency. The correction process takes about 250 milliseconds and is automatic whenever the operator requests the external DCFM mode.

The counter plus its associated hardware and software is also used for several additional functions: enhancement of internal audio frequency setting accuracy; continuous display of the actual output frequency of the synthesizer when in the DCFM mode; and correction of any VCO frequency drift during DCFM mode operation after the initial correction for the frequency change when the PLL was unlocked.

DESCRIPTION OF THE PREFERRED EMBODIMENT

Figure 1:
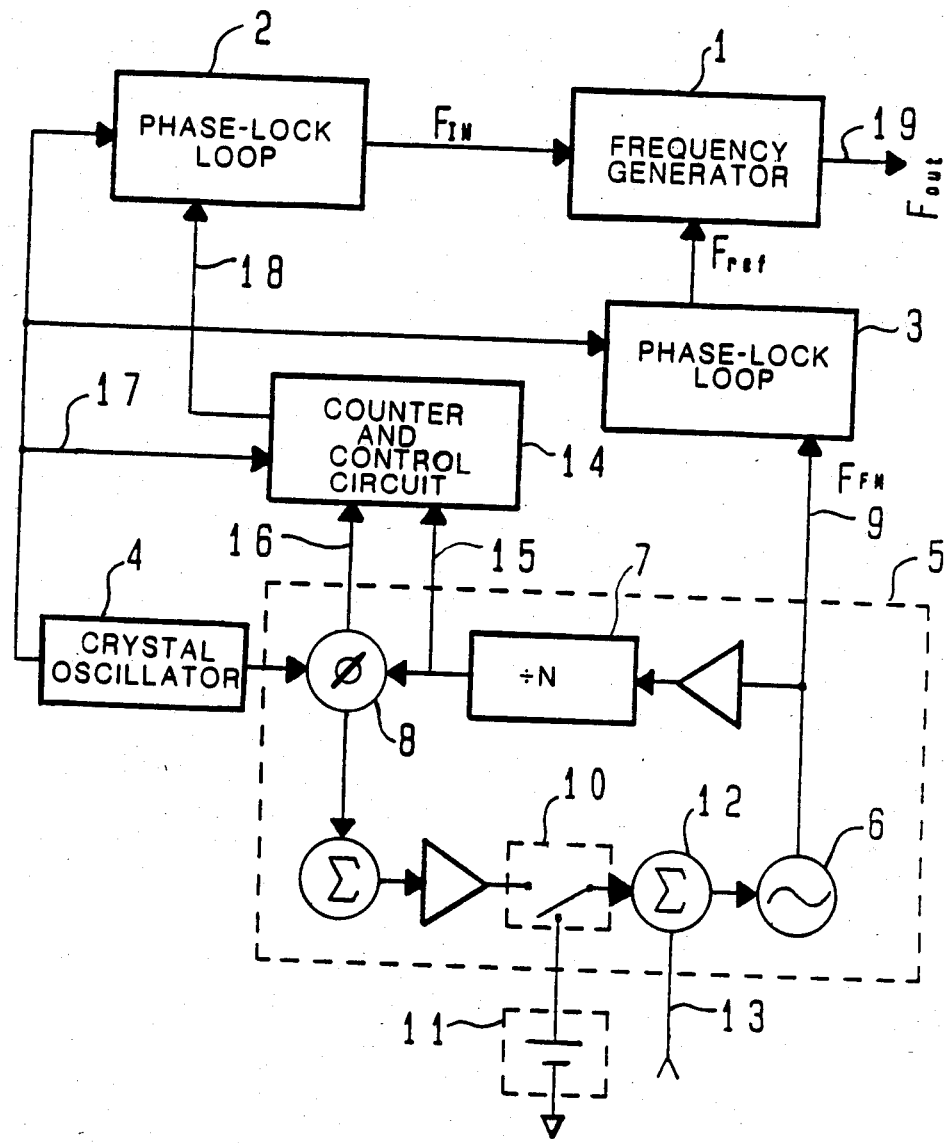
FIG. 1 is a detailed block diagram of the preferred embodiment of the present invention.

FIG. 1 is a detailed block diagram of the preferred embodiment in accordance with the present invention. A frequency synthesizer comprises a frequency generating means 1, utilizing a frequency mixing means (not shown), responsive to an input signal, $F_{in}$, and a reference signal, $F_{ref}$, to provide an output signal, $F_{out}$, which is continuously variable over a desired frequency range. The input frequency, $F_{in}$, is synthesized by a PLL 2 utilizing the fractional N technique disclosed in U.S. Pat. No. 3,928,813 issued to Charles A. Kingsford-Smith on Dec. 23, 1975, entitled "Device for Synthesizing Frequencies which are Rational Multiples of a Fundamental Frequency". The reference signal, $F_{ref}$, is provided by a PLL 3 by frequency mixing an FM reference signal, $F_{FM}$, with the outputs of a plurality of high-Q oscillators (not shown). The timebase for the frequency synthesizer is generated by a crystal controlled oscillator 4 at a frequency of 45 MHz.

The FM reference signal PLL 5 comprises a tunable oscillator 6, such as a voltage controlled oscillator (VCO), a divide-by-N block 7 and a phase detector 8. Since it is easier to FM a fixed frequency signal than a signal that is varied over a given output range, the output of PLL 5, $F_{FM}$ on line 9, is locked at 135 MHz. Further, a signal in the 50 MHz to 150 MHz range gives the best trade-offs of noise and FM performance. The phase of the output of VCO 6 via divide-by-N block 7 is compared to the phase of a reference signal derived from the time base 4 output by phase detector 8 to provide an error signal which locks the loop to the desired frequency. The error signal is coupled to the VCO 6 via switch 10.

In the DCFM mode, switch 10, via microprocessor control, interrupts the error signal to the VCO 6 hence unlocking the PLL 5. When the loop is unlocked, source 11 is coupled to the VCO 6, via the switch 10, to hold the VCO 6 at an approximate frequency of 135 MHz, and the VCO tune line 13 is made available for operator control. When the loop is unlocked, the VCO 6 output frequency will offset up to 200 KHz away from its normal phase locked frequency of 135 MHz. The VCO 6 control voltage provided by the source 11 is summed with external or internal FM or phase modulation signals in summer block 12 prior to being applied to VCO 6.

When the DCFM mode is entered, a counter and control circuit 14, responsive to signals on lines 15, 16 and 17, will count the FM PLL 5 frequency after the loop has unlocked. After the frequency offset from 135 MHz has been calculated, a compensation signal on line 18 is coupled to the fractional N PLL 2 to correct the synthesizer output, $F_{out}$, on line 19 for the effects of the frequency offset of VCO 6. When the DCFM mode is exited, the compensation signal is automatically removed and the FM PLL 5 is returned to the phase-locked mode. In addition to correcting for the initial frequency offset, the counter and control circuit 14 may be utilized to correct for any frequency drift in the unlocked FM VCO 6.

Figure 2:
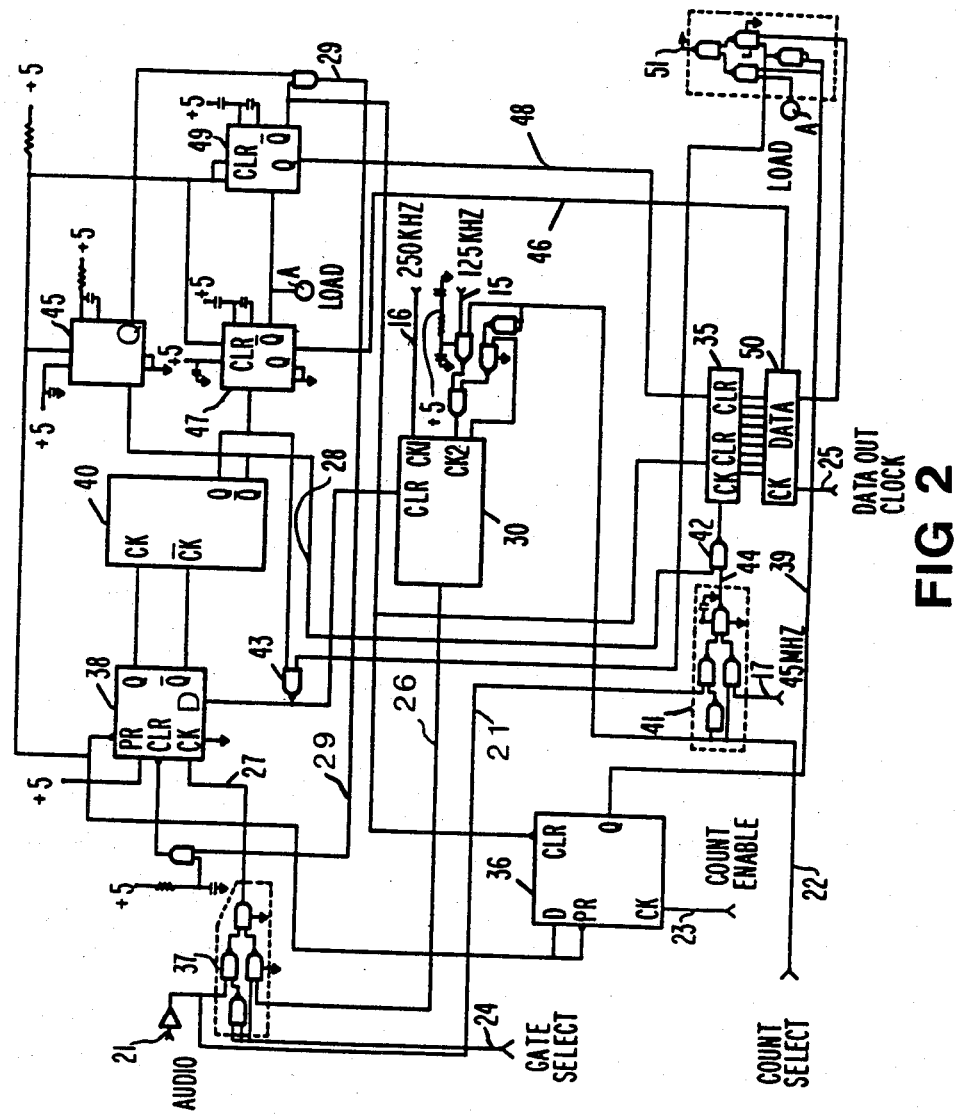
FIG. 2 is a detailed block diagram of the counter utilized in the embodiment and illustrated in FIG. 1.

Referring now to FIG. 2, a three mode counter is utilized to count the frequency of an internal audio modulation oscillator (not shown) and the frequency of the FM VCO 6 (FIG. 1) when it is in the DCFM mode. The counter has four input signals: (1) a 250 KHz signal (TTL), derived from the timebase and taken from the FM loop phase detector 8 (FIG. 1) on line 16; (2) the divide-by-1080 block 7 (FIG. 1) on line 15, when the FM PLL 5 (FIG. 1) is locked this will be 125 KHz, when in the DCFM mode, this will be approximately 125 KHz (TTL); (3) a TTL signal generated in the audio modulation section (not shown) on line 21; and (4) a 45 MHz (TTL) signal from the time base on line 17. In addition, there are four control signals: (1) COUNT SELECT on line 22, (2) GATE SELECT on line 24, (3) COUNT ENABLE on line 23, and (4) DATA OUT CLOCK on line 25.

The counter operates in one of three modes:

(1) The FM VCO 6 (FIG. 1) output frequency is obtained by further dividing the 125 KHz signal on line 15 by 12,500 in divider block 30 to provide a gate clock of approximately 10 Hz on line 26. The 45 MHz signal on line 17 is then counted by the count chain 35 over one period of the gate clock.

(2) Audio frequencies greater than 10 KHz are counted directly. The gate clock on line 26 is provided by further dividing the time base derived 250 KHz signal on line 16 by 25,000 in divider block 30 to give a gate clock of 10 Hz. The audio signal (TLL) is then counted by count chain 35 over the period of the gate clock.

(3) Audio frequencies less than 10 KHz are counted in a reciprocal mode to provide quicker counter response times. The gate clock on line 26 is inhibited by the GATE SELECT signal on line 24, and the TTL audio signal on line 21 is used to gate the count chain 35. The 45 MHz signal on line 17 is then counted over the period of the audio signal on line 21.

When the counter is required, the counter takes only one reading, and then shuts itself off. When the counter is not required, it is in an idle mode and the 10 Hz gate clock and 45 MHz count are selected. The COUNT ENABLE signal on line 23 strobes the clock of flip-flop 36 to allow a reading to be taken. When flip-flop 36 Q goes high, it forces the D input of the gate clock edge detector flip-flop 38 high. Multiplexer 37 multiplexes audio on line 21 or the gate clock on line 26 onto the gate input line 27. The gate signal on line 27 is coupled to the clock input of flip-flop 38 which detects positive edges of the gate signal. The Q and $\overline{Q}$ outputs of flip-flop 38 are coupled to a state machine 40. The state machine 40 is asynchronous and has four states.

State D: Binary code 10; flip-flop 38 detects a rising edge on the gate signal on line 27. Begin counting by enabling NAND gate 42 with the $\overline{Q}$ output of the state machine 40 on line 28. Clear edge detector flip-flop 38 so that the next positive edge of the gate signal can be detected. The edge detector is cleared by the $\overline{Q}$ output on line 28 triggering a one-shot multivibrator 45 which generates a 5 microsecond pulse on line 29 which clears flip-flop 38.

State A: Binary code 00; state A is entered from state D when state machine 40 detects that the edge detector flip-flop 38 has been cleared. NAND gate 42 is still enabled and counting continues.

State B: Binary code 01; a rising edge on the gate clock has been detected by the edge detector flip-flop 38. Stop counting by disabling NAND gate 42. The Q output of the state machine 40 triggers one-shot multivibrator 47 which generates a 5 microsecond pulse on line 46 which loads the data latches 50 with the contents of the count chain 35. The falling edge of the Q output of one-shot multivibrator 47 triggers one-shot multivibrator 49 which also generates a 5 microsecond pulse. The Q output of one-shot multivibrator 49 on line 48 clears the count chain 35 and the $\overline{Q}$ output clears the edge detector flip-flop 38.

State C: Binary code 11; state C is entered from state B when the edge detector flip-flop 38 has been cleared. NAND gate 42 remains disabled and the counter remains in state C until a rising edge is detected by the edge detector flip-flop 38 which resets the state machine 40 to state D.

When the count chain 35 is cleared, flip-flop 36 is also cleared. The clearing of flip-flop 36 allows the latched data to appear on the DATA BACK line 51. Prior to flip-flop 36 being cleared, a load pulse appears on the DATA BACK line 51, indicating the completion of a frequency measurement. The Q output of flip-flop 36 on line 39 is anded with the second bit of the state machine 40 at NAND gate 43 to insure that the state machine 40 will come to rest in state C upon power up, or any other possible transient conditions. If the second bit of the state machine 40 is 0, it will force the D input of the edge detector flip-flop 38 high and the counter will continue running until state B is reached. State C will automatically follow state B, even when all inputs are removed.

Multiplexer 41 multiplexes the 45 MHz on line 17 and the TTL audio signal on line 21 onto line 44 to be gated to the count chain 35. When the counter is idling, 45 MHz is selected for ease of filtering off of the supply lines. Since NAND gate 42 is disabled when the counter is in the idle mode, no noise will be generated by the count chain 35.

Figure 3:
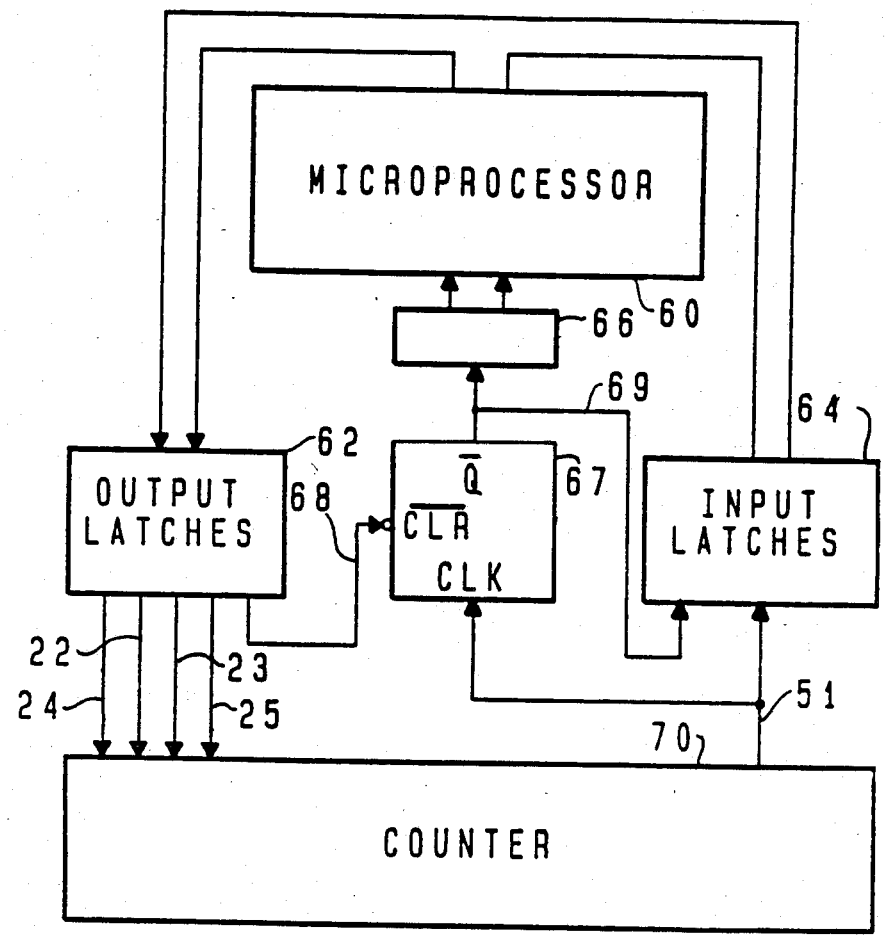
FIG. 3 is a block diagram of the microprocessor control logic for the counter of the embodiment illustrated in FIG. 1.

Referring now to FIG. 3, the counter control circuitry comprises a microprocessor 60 with associated input and output latches 64 and 62 respectively and interrupt hardware 66. The microprocessor 60 controls operation of the counter 70 in all three modes of operation: Direct Audio, Reciprocal Audio and Reciprocal DCFM. The microprocessor 60 controls the counter 70 by inputing four control signals: GATE SELECT on line 24, COUNT SELECT on line 22, COUNT ENABLE on line 23 and DATA OUT CLOCK on line 25. The 24 bit count stored in the data latches 50 (as shown in FIG. 2) is output by the counter in serial form on DATA BACK line 51.

The counter 70 is always left in the reciprocal DCFM mode when it is not being used (idling). It is assumed that the following initial conditions exist each time prior to the counter 70 being used by the microprocessor 60:

CNT INT DIS (on line 68)=0
CNT RDY INT (on line 69)=1
GATE SELECT (on line 24)=1
COUNT SELECT (on line 22)=1

CNT INT DIS on line 68 is set to 1 which sets up flip-flop 67 to reset CNT RDY INT on line 69 from 1 to 0 on the next 0 to 1 transition of CNT DATA BACK on DATA BACK line 51. Counter 70 is put into the required mode by setting the GATE SELECT and COUNT SELECT bits as follows:

| GATE SELECT | COUNT SELECT | MODE |
| --- | --- | --- |
| 1 | 0 | Direct Audio |
| 0 | 1 | Reciprocal Audio |
| 1 | 1 | Reciprocal DCFM |

COUNT ENABLE on line 23 is set to 0 and then set to 1 which strobes flip-flop 36 (as shown in FIG. 2) and starts the actually counting process. When the counter 70 has completed the count (approximately 200 milliseconds). CNT DATA BACK on line 51 goes from 0 to 1 which clocks flip-flop 67 causing CNT RDY INT on line 69 to go from 1 to 0. The transition of the CNT RDY INT line signals the microprocessor 60 that the counter 70 has completed counting, either by interrupting the microprocessor (as when the counter 70 is utilized to update the DCFM display) or by the microprocessor polling the CNT RDY INT line 69 (as when the counter is utilized for audio frequency counting or DCFM frequency correction).

The CNT INT DIS on line 68 is now caused to go from 1 to 0 which causes the CNT RDY INT on line 69 to go from 0 to 1 which removes any pending interrupt that the microprocessor 60 may be servicing and sets up the input latches 64. The most significant bit of the 24 bit count stored in data latches 50 (as shown in FIG. 2) is now available to the microprocessor on line 51. The remaining 23 bits are made available to the microprocessor by iterating the following sequence 23 times:

Set DATA OUT CLOCK (on line 25) to 0
Set DATA OUT CLOCK (on line 25) to 1
Read DATA BACK line 51

When the microprocess is done with the counter, it sets the counter to the reciprocal DCFM mode by setting both GATE SELECT on line 24 and COUNT SELECT on line 22 to 1. The microprocessor now utilizes the 24 bit binary count as follows:

| Mode | Formula |
| --- | --- |
| Direct Audio | (24 bit count) * 10 = audio frequency in Hz |
| Reciprocal Audio | 45000000/(24 bit count) = audio frequency in Hz |
| Reciprocal DCFM | (45000000 * 13500000)/(24 bit count) = FM loop frequency in Hz (FM PLL 5 as shown in FIG. 1) |

We claim:
1. A closed loop frequency synthesizer for generating a final output signal, said synthesizer comprising:
frequency generating means responsive to an input signal and a reference signal, said frequency generating means for generating the final output signal;
a first phase-locked loop coupled to the frequency generating means, said first phase-locked loop having a tunable oscillator, said tunable oscillator responsive to a tune voltage on a tune line to adjust the frequency of the tunable oscillator, said first phase-locked loop for synthesizing a first signal having a predetermined frequency when the phase-locked loop is locked, said first signal comprising said reference signal when the first phase-locked loop is locked;
voltage source means for biasing said tunable oscillator;
switching means for unlocking said first phase-locked loop, coupling the tunable oscillator to said voltage source and for making the tune line available for inputting DC frequency modulation signals, said tunable oscillator responsive to said voltage source to generate a second signal having a frequency close to said predetermined frequency, said second signal comprising the reference signal when said first phase-locked loop is unlocked;
control means coupled to the first phase-locked loop, said control means including frequency counter means, said frequency counter means for counting the frequency of said second signal, said control means responsive to said second signal and a third signal, said third signal indicative of said predetermined frequency, said control means providing an error signal indicative of the frequency difference between said second signal and said third signal; and
a second phase-locked loop coupled to said frequency generating means and to said control means, said second phase-locked loop for providing said input signal, said second phase-locked loop responsive to said error signal to compensate said input signal to correct the final output signal for the effect of the frequency difference in the reference signal when said first phase-locked loop is unlocked.

2. A method for DC frequency modulation of an output signal generated by a frequency synthesizer comprising a plurality of phase-locked loops and an internal frequency counter, said method comprising:
synthesizing a predetermined frequency within a first phase-locked loop, said first phase-locked loop comprising a tunable oscillator responsive to a tune voltage on a tune line, to provide a reference signal;
unlocking said first phase-locked loop to make the tunable oscillator tune line available for DC frequency modulation input signals for modulating said reference signal;
biasing said tunable oscillator to a fixed tune voltage source for tuning said tunable oscillator to a first frequency close to said predetermined frequency;
counting said first frequency and providing a first signal indicative of said first frequency;
comparing said first signal with a second signal, said second signal indicative of said predetermined frequency, for providing an error signal indicative of the difference between said predetermined frequency and said first frequency; and
utilizing said error signal in a second phase-locked loop responsive to said error signal to compensate the output signal for said difference in frequency of said reference frequency.

* * * * *